(12) United States Patent
Walsh et al.

(10) Patent No.: US 11,527,857 B2
(45) Date of Patent: Dec. 13, 2022

(54) METERING ASSEMBLY, ADAPTER, AND CONVERTING METHOD THEREFOR

(71) Applicant: EATON INTELLIGENT POWER LIMITED, Dublin (IE)

(72) Inventors: Patrick T. Walsh, Coraopolis, PA (US); Andrew Courson, McGrann, PA (US); Jay Haugen, Pittsburgh, PA (US); Sandy Jimenez, Monica, PA (US); Richard M. Eubanks, Jr., Sewickley, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 238 days.

(21) Appl. No.: 16/200,851

(22) Filed: Nov. 27, 2018

(65) Prior Publication Data
US 2020/0169050 A1 May 28, 2020

(51) Int. Cl.
| | |
|---|---|
| *H01R 31/06* | (2006.01) |
| *H01H 71/08* | (2006.01) |
| *H01H 71/02* | (2006.01) |
| *H01R 9/18* | (2006.01) |
| *H01R 9/22* | (2006.01) |
| *H02H 1/00* | (2006.01) |
| *H02H 3/08* | (2006.01) |
| *G01R 22/00* | (2006.01) |

(52) U.S. Cl.
CPC ........... *H01R 31/06* (2013.01); *H01H 71/025* (2013.01); *H01H 71/08* (2013.01); *H01R 9/18* (2013.01); *H01R 9/22* (2013.01); *H02H 1/0007* (2013.01); *H02H 3/08* (2013.01); *G01R 22/00* (2013.01); *H01H 2071/088* (2013.01); *H01H 2207/022* (2013.01); *H01H 2207/026* (2013.01); *H01R 2201/20* (2013.01)

(58) Field of Classification Search
CPC .... H01H 71/025; H01H 71/08; H01H 1/0007; H01H 2071/088; H01H 2207/022; H01H 2207/026
See application file for complete search history.

(56) References Cited

U.S. PATENT DOCUMENTS

| | | | | |
|---|---|---|---|---|
| 4,505,530 | A * | 3/1985 | Fennel | G01R 11/24 439/148 |
| 5,572,396 | A * | 11/1996 | Robinson | G01R 1/36 361/127 |

(Continued)

OTHER PUBLICATIONS

ConnectDER; "Products", http://connectder.com/products/, Nov. 27, 2018, pp. 1-9.

(Continued)

*Primary Examiner* — Rafael O De Leon Domenech
(74) *Attorney, Agent, or Firm* — Eckert Seamans Cherin & Mellott, LLC

(57) ABSTRACT

An adapter is for a metering assembly. The metering assembly includes an electrical switching apparatus and a socket assembly. The socket assembly has a plurality of jaw members. The adapter includes a base member and a plurality of electrical contacts each coupled to the base member and structured to be mechanically coupled and electrically connected to a corresponding one of the jaw members. Each of the electrical contacts is structured to be electrically connected to the electrical switching apparatus.

27 Claims, 13 Drawing Sheets

(56) References Cited

U.S. PATENT DOCUMENTS

| | | | | |
|---|---|---|---|---|
| 5,590,179 | A * | 12/1996 | Shincovich | G01R 22/00 |
| | | | | 340/870.03 |
| 6,066,271 | A * | 5/2000 | Hormadaly | H01C 17/0654 |
| | | | | 252/521.2 |
| 6,104,586 | A * | 8/2000 | Robinson | H01H 83/20 |
| | | | | 361/102 |
| 6,198,176 | B1 | 3/2001 | Gillette | |
| 6,520,798 | B1 * | 2/2003 | Robinson | G01R 11/04 |
| | | | | 361/663 |
| 9,735,527 | B2 * | 8/2017 | Bautista | H01R 27/02 |
| 10,819,140 | B1 | 10/2020 | Maalouf et al. | |
| 11,086,346 | B2 * | 8/2021 | Parks | B60L 53/16 |
| 2002/0075622 | A1 * | 6/2002 | Robinson | H02B 1/03 |
| | | | | 361/127 |
| 2006/0138868 | A1 * | 6/2006 | Wareham | H02J 9/066 |
| | | | | 307/126 |
| 2008/0180885 | A1 * | 7/2008 | Loehr | H01R 13/648 |
| | | | | 361/663 |
| 2020/0153208 | A1 * | 5/2020 | Miller | H02B 1/03 |
| 2021/0006073 | A1 | 1/2021 | Donahue et al. | |
| 2021/0028648 | A1 | 1/2021 | Gamroth et al. | |

OTHER PUBLICATIONS

USPTO "Non-Final Office Action" for corresponding U.S. Appl. No. 17/173,322, dated Mar. 29, 2022, 21 pp.
USPTO "Final Office Action" for corresponding U.S. Appl. No. 17/173,322, dated Oct. 17, 2022, 29 pp.

* cited by examiner

METERING ASSEMBLY, ADAPTER, AND CONVERTING METHOD THEREFOR

BACKGROUND

Field

The disclosed concept relates generally to adapters. The disclosed concept also relates to metering assemblies including adapters. The disclosed concept further relates to methods of converting electrical connections of a socket assembly to electrical connections for an electrical switching apparatus.

Background Information

Metering assemblies commonly include standard electrical meters connected to socket assemblies. However, such metering assemblies suffer from a number of drawbacks. For example, they typically do not have adequate thermal protection, and as such rely on separately attached circuit interrupters (e.g., without limitation, circuit breakers and fuses) to protect the circuits from overload conditions. This is neither efficient nor cost effective. Furthermore, electrical contacts in standard electrical meters are typically not compliant with certain standards, such as, for example and without limitation, UL 508 Standard by Underwriters Laboratories Inc., headquartered in Northbrook, Ill. As a result, these meters are only able to be employed in a relatively limited number of applications.

There is, therefore, room for improvement in metering assemblies, and in adapters and converting methods therefor.

SUMMARY

These needs and others are met by embodiments of the invention, which are directed to an improved metering assembly, and adapter and converting method therefor.

As one aspect of the disclosed concept, an adapter for a metering assembly is provided. The metering assembly includes an electrical switching apparatus and a socket assembly. The socket assembly has a plurality of jaw members. The adapter includes a base member and a plurality of electrical contacts each coupled to the base member and structured to be mechanically coupled and electrically connected to a corresponding one of the jaw members. Each of the electrical contacts is structured to be electrically connected to the electrical switching apparatus.

As another aspect of the disclosed concept, a metering assembly includes an electrical switching apparatus, a socket assembly having a plurality of jaw members, and the aforementioned adapter.

As another aspect of the disclosed concept, a method of converting electrical connections of a socket assembly to electrical connections for an electrical switching apparatus is provided. The method includes the steps of providing the socket assembly with a plurality of jaw members, providing an adapter having a base member and a plurality of electrical contacts each coupled to the base member, mechanically coupling and electrically connecting each of the plurality of electrical contacts to a corresponding one of the plurality of jaw members, and electrically connecting each of the plurality of electrical contacts to the electrical switching apparatus.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the singular form of "a", "an", and "the" include plural references unless the context clearly dictates otherwise. Still further, as used herein, the term "number" shall mean one or an integer greater than one (e.g., a plurality).

As employed herein, the term "coupled" shall mean that two or more parts are joined together directly or joined through one or more intermediate parts. Furthermore, as employed herein, the phrase "directly connected" shall mean that two or more parts are joined together directly, without any intermediate parts being disposed therebetween at the point or location of the connection.

As employed herein, the phrase "electrically connected" shall mean that two or more parts or components are joined together either directly or joined through one or more intermediate parts such that electricity, current, voltage, and/or energy is operable to flow from one part or component to the other part or component, and vice versa.

Example 1

Figure 1:
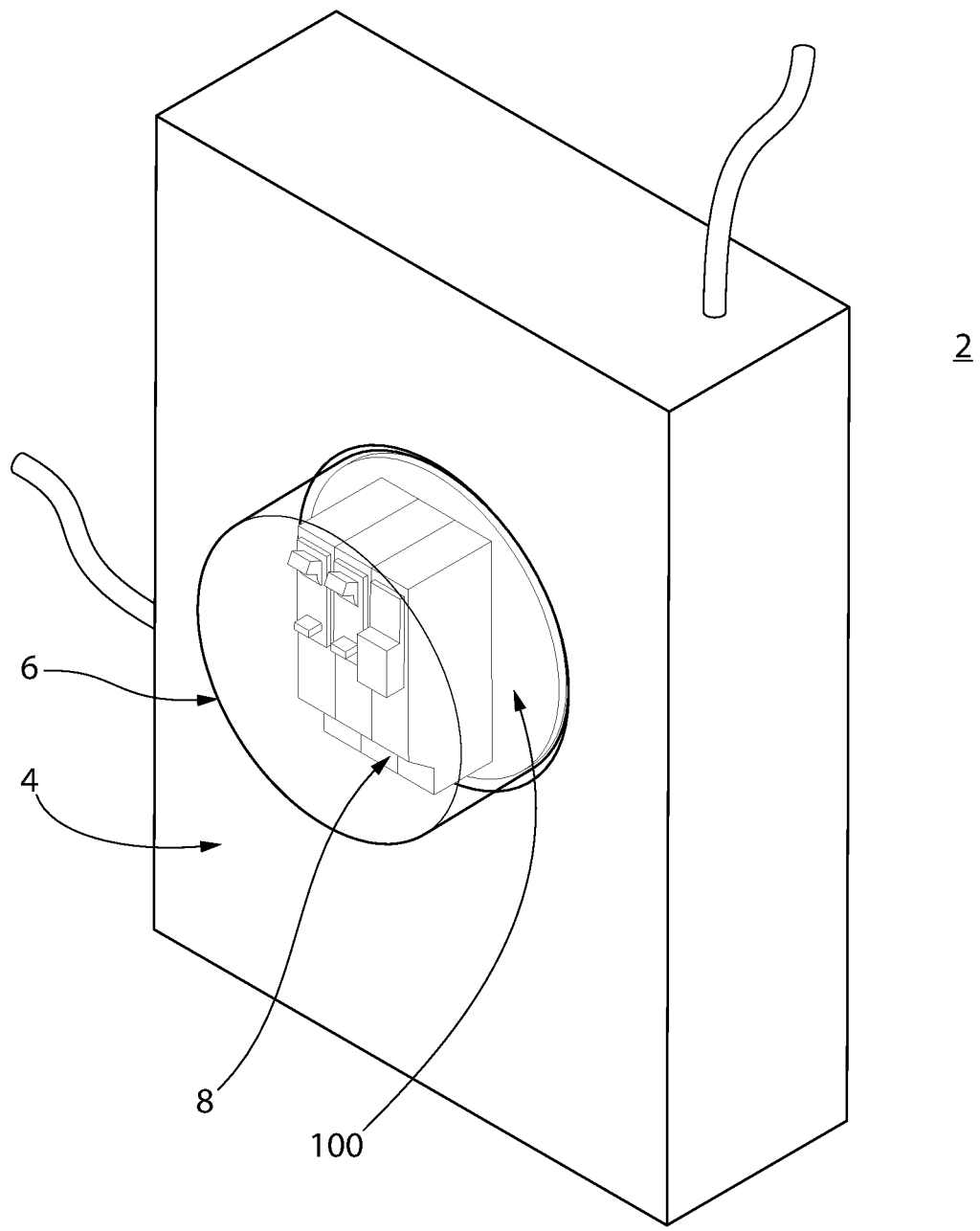
FIG. 1 is an isometric view of a metering assembly and adapter therefor, shown with a housing assembly, in accordance with one non-limiting embodiment of the disclosed concept.

FIG. 1 is an isometric view of a metering assembly 2, shown as employed with a housing assembly 4, in accordance with one non-limiting embodiment of the disclosed concept. The metering assembly 2 includes an electrical switching apparatus (e.g., without limitation, multi-pole energy management circuit breaker 8), a socket assembly 10 (shown in FIGS. 2-5, 8, and 9), and an adapter 100. The housing assembly 4 includes a casing 6, optionally transparent, substantially surrounding the circuit breaker 8. As will be discussed in greater detail below, the adapter 100 provides an interface between a circuit breaker (e.g., the circuit breaker 8) and the socket assembly 10. It will be appreciated that the socket assembly 10 may be an existing socket assembly on the outside of a house, one used to mate with an electrical meter. Accordingly, the disclosed concept, e.g. via the adapter 100, provides a mechanism to remove such an electrical meter and easily install the circuit breaker 8 onto the socket assembly 10.

Figure 2:
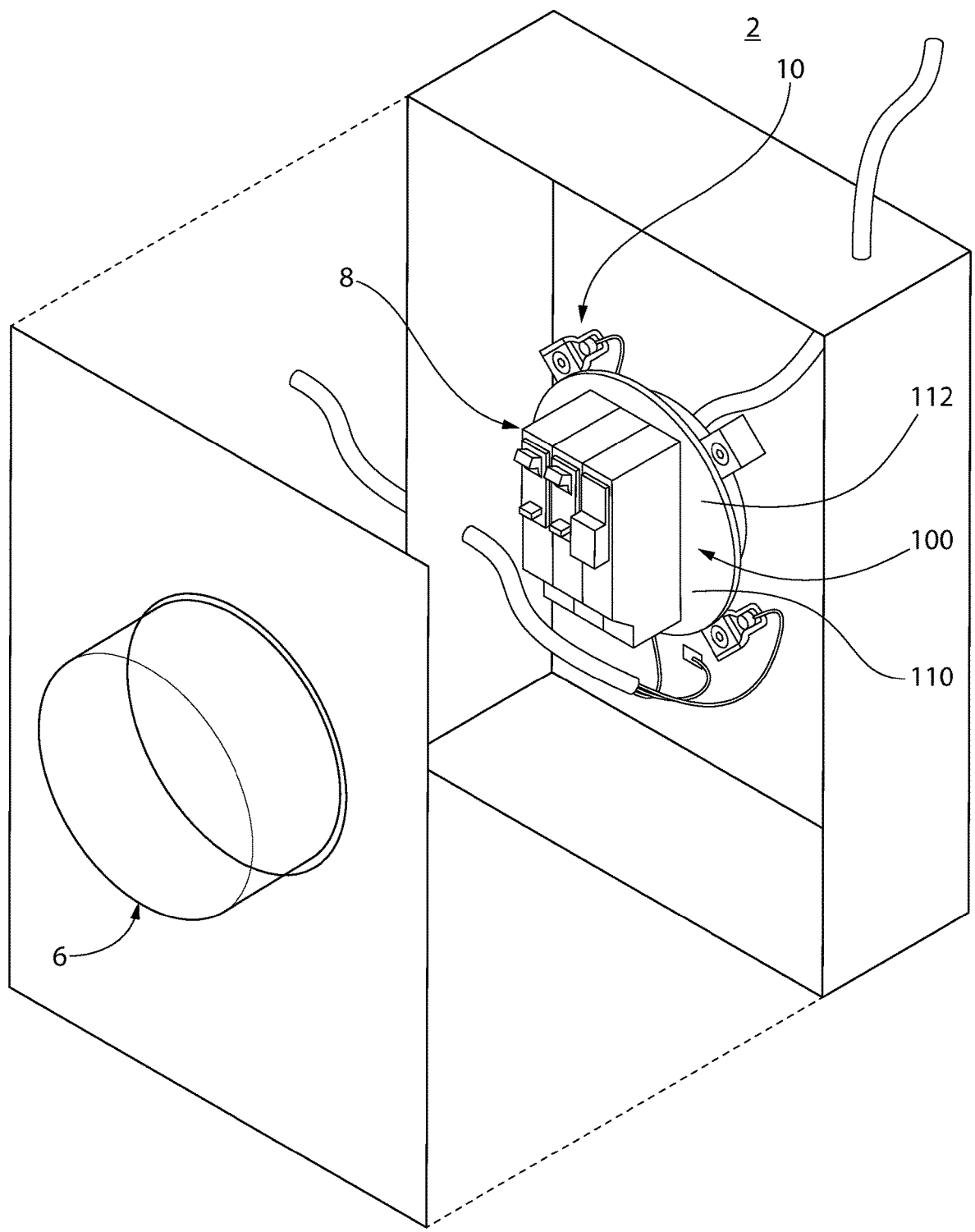
FIGS. 2 and 3 are different isometric views of the metering assembly and adapter therefor of FIG. 1, shown with portions of the housing assembly exploded and/or removed in order to see hidden structures.
Figure 3:
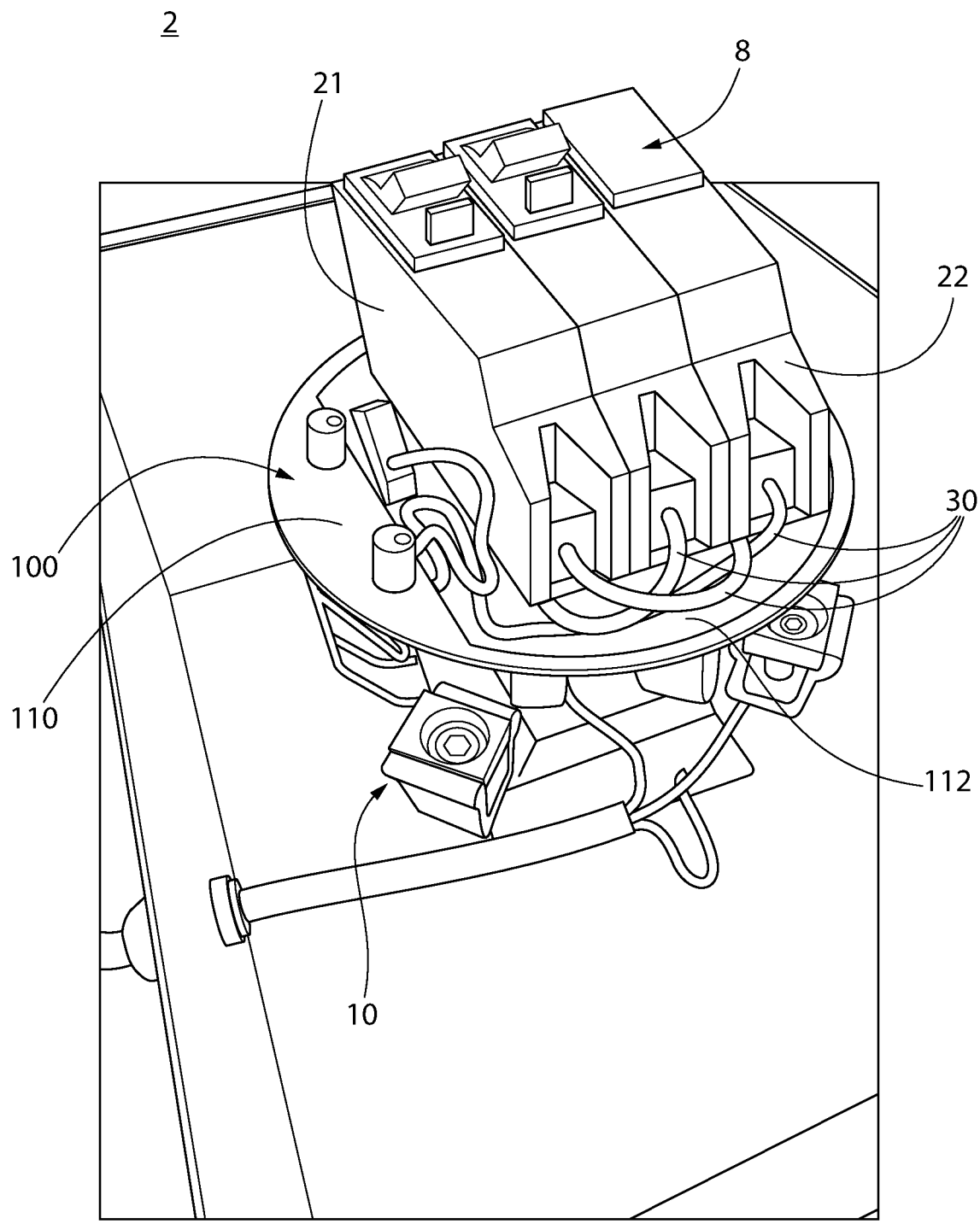

FIG. 2 shows the metering assembly 2 with the housing assembly 4 partially exploded. As shown, the circuit breaker 8 is mechanically coupled and electrically connected to the adapter 100, which is mechanically coupled and electrically connected to the socket assembly 10. FIG. 3 shows another view of the metering assembly 2, and as shown, the circuit breaker 8 includes a first terminal end 21 and a second terminal end 22. As will be discussed later, the first terminal end 21 is configured to be plugged onto the adapter 100, and the second terminal end 22 is configured to be electrically connected to the adapter 100 via a plurality of electrical wires 30. However, it will be appreciated that a suitable alternative metering assembly (not shown) may be employed with a bolt-on circuit breaker, without departing from the scope of the disclosed concept.

Figure 4:
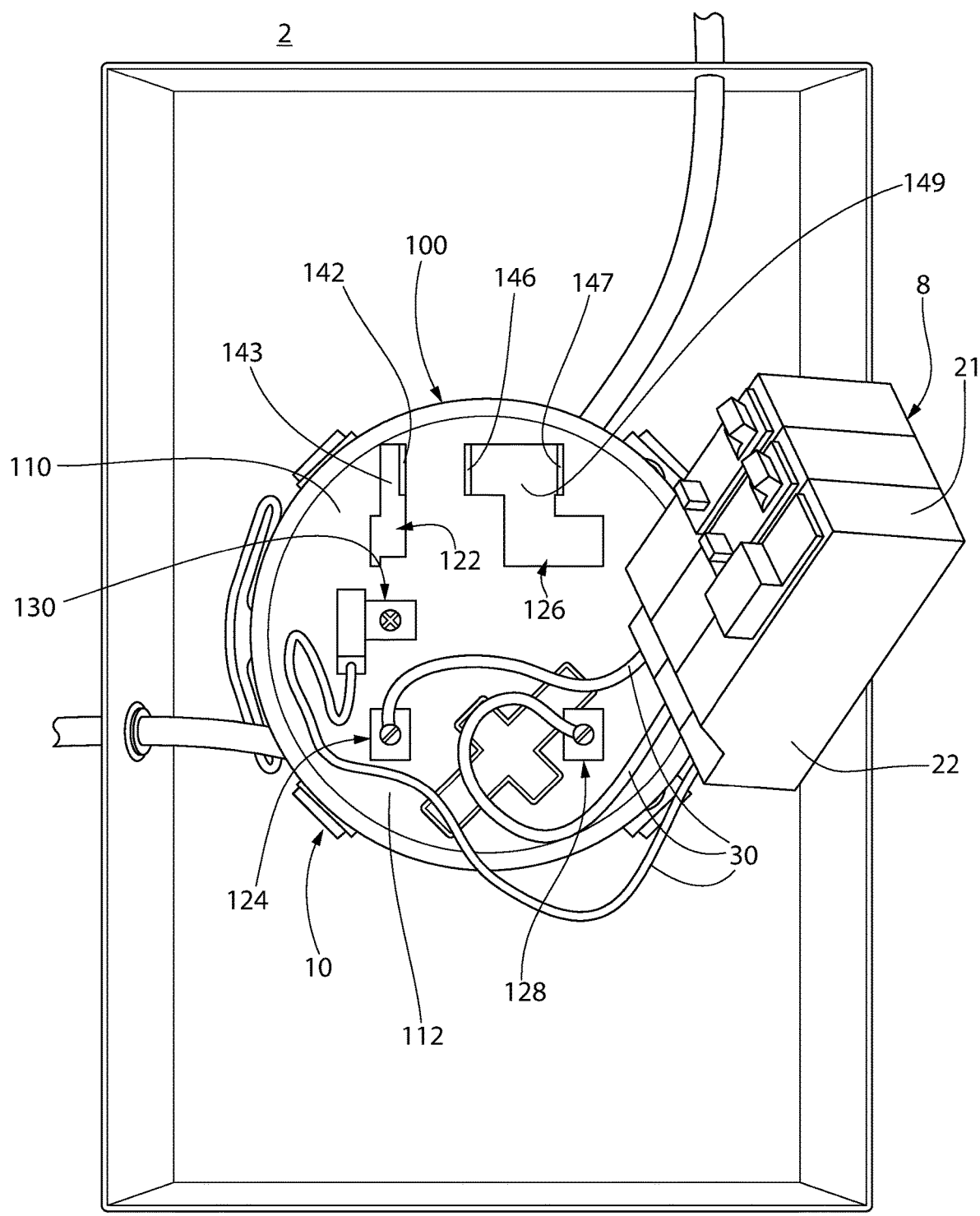
FIG. 4 is a top view of the metering assembly and adapter therefor of FIGS. 2 and 3, shown with the electrical switching apparatus partially removed from the adapter in order to see hidden structures.
Figure 5:
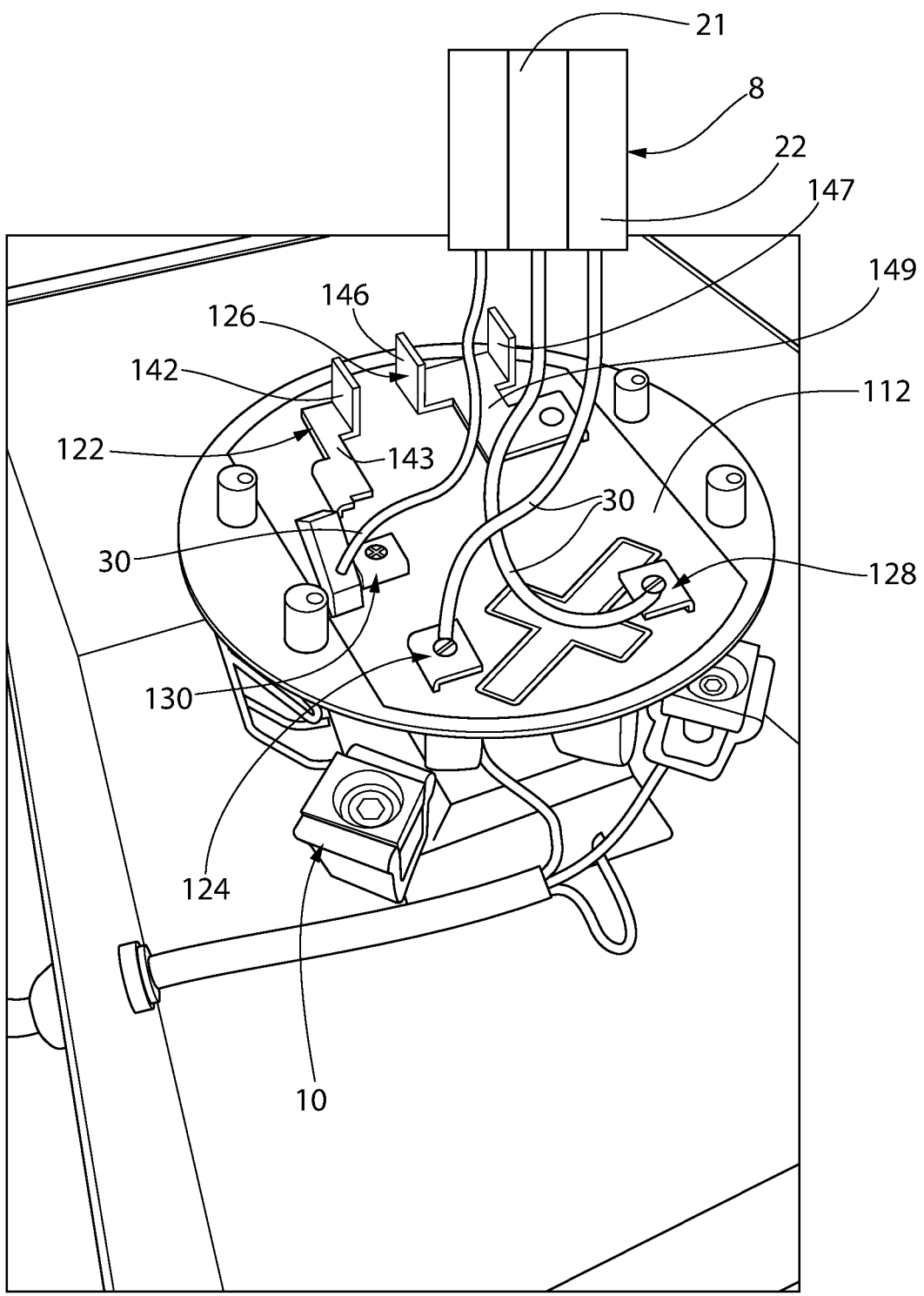
FIG. 5 is an isometric view of the metering assembly and adapter therefor of FIG. 4.
Figure 6:
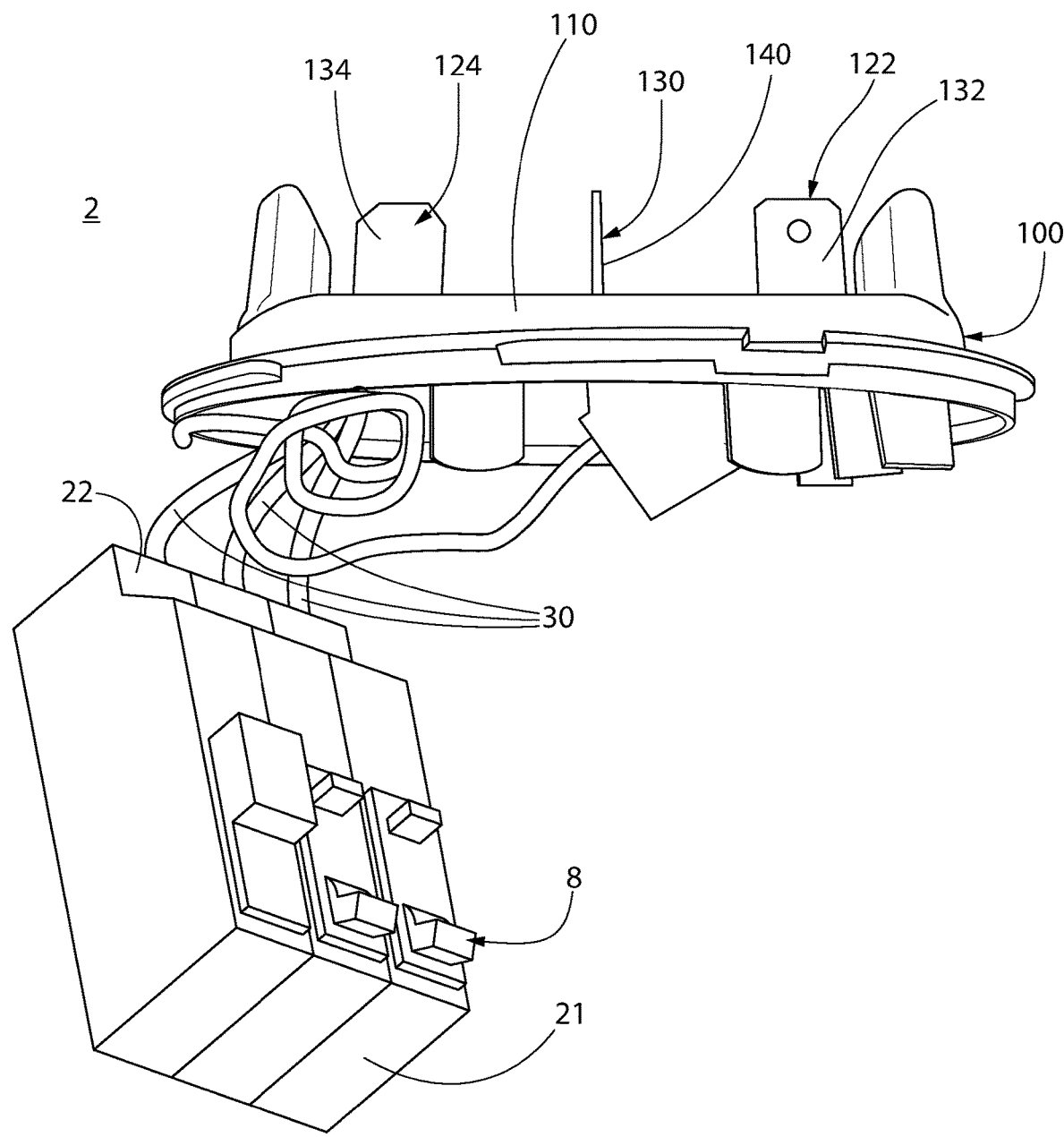
FIG. 6 is a side elevation view of the metering assembly and adapter therefor of FIG. 5, shown without the socket assembly and with the electrical switching apparatus partially removed from the adapter in order to see hidden structures.

FIGS. 4-6 are different views of the metering assembly 2 and adapter 100 therefor, each shown with the circuit breaker 8 partially disconnected from the adapter 100, in order to see hidden structures. The adapter 100 includes a base member 110 and a plurality of electrical contacts 122,124,126,128,130 each mechanically coupled to the base member 110 and electrically connected to the circuit breaker 8. The base member 110 is preferably made of rigid thermoplastic material. The electrical contacts 122,124,126,128, 130 are preferably made of a suitable electrically conductive material, such as copper or other metallic materials. The circuit breaker 8 is located on a first side of the base member 110 and the socket assembly 10 is located on a second, opposing side of the base member 110. Referring to FIG. 5, the first terminal end 21 of the circuit breaker 8 is configured to be plugged on to the electrical contacts 122,126, and the second terminal end 22 of the circuit breaker 8 is electrically connected to the electrical contacts 124,128,130 via the electrical wires 30. Furthermore, as shown in FIG. 6, the electrical contacts 122,124,130 each extend through the base member 110. See also, for example, FIG. 7, which shows a bottom view of the adapter, and the electrical contacts 122,124,126,128,130, each of which extends through the base member 110.

Figure 7:
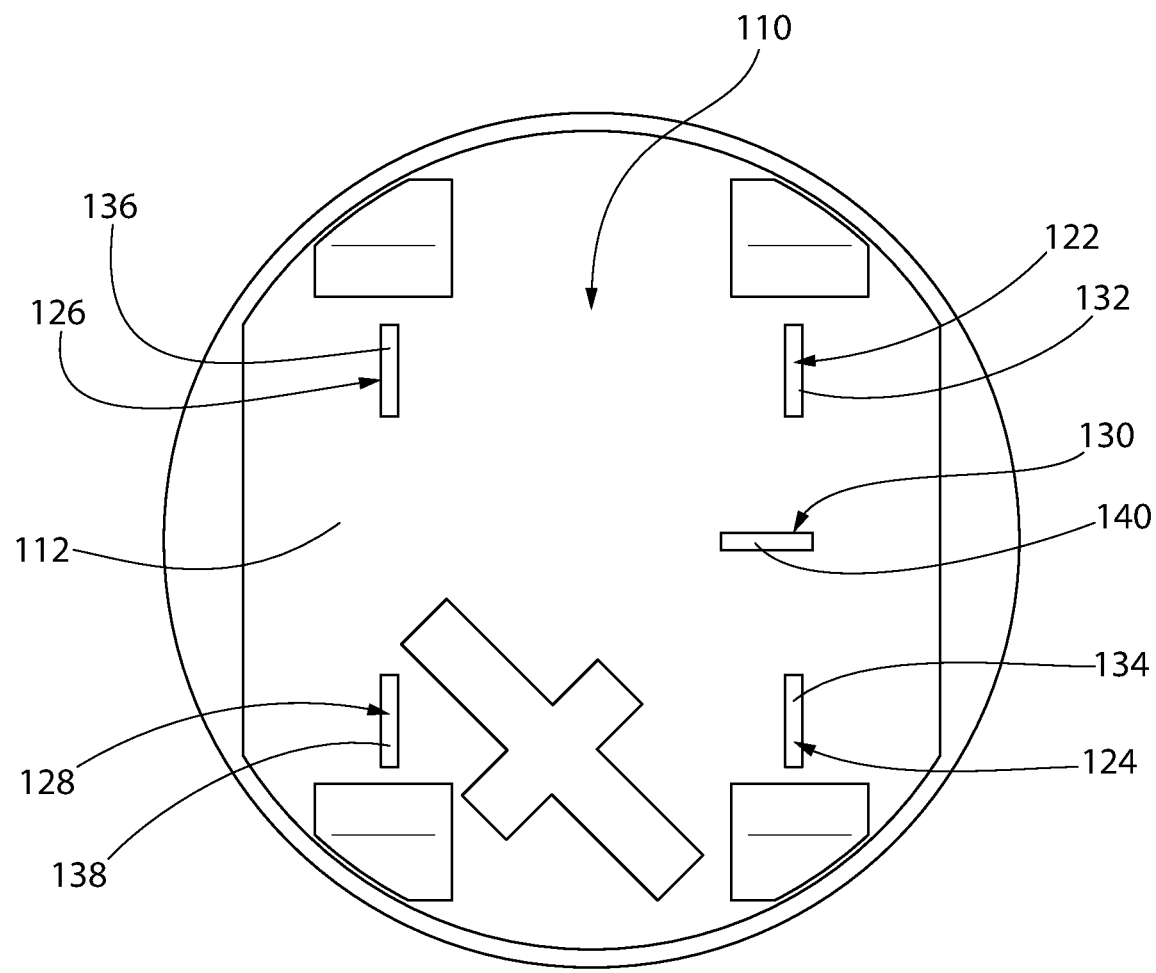
FIG. 7 is a bottom view of the adapter of FIG. 5.
Figure 8:
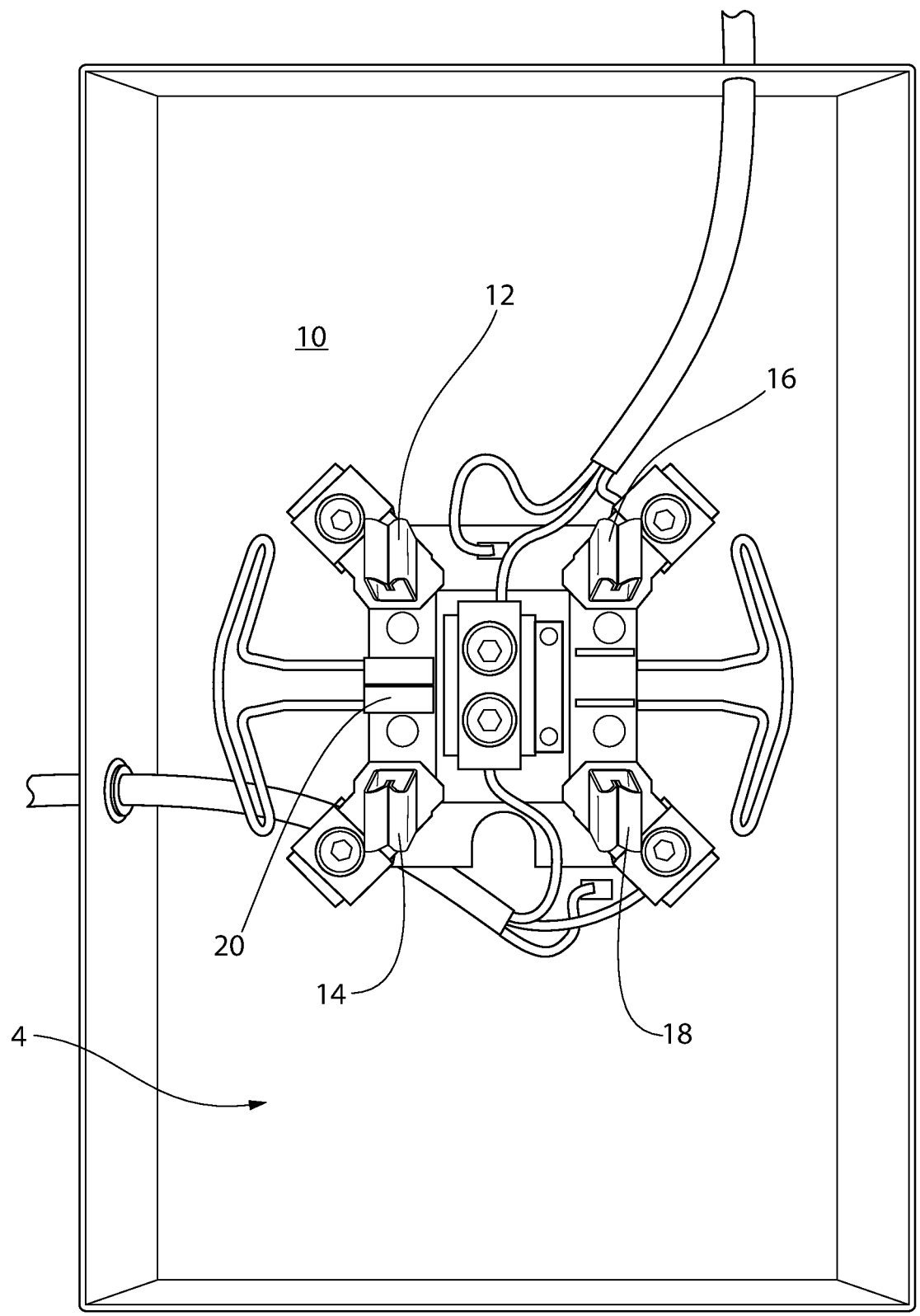
FIG. 8 is a top view of the socket assembly, shown as employed on a portion of the housing assembly.

FIG. 8 shows a top view of the socket assembly 10. As shown, the socket assembly 10 includes a plurality of jaw members 12,14,16,18,20. Referring again to FIGS. 4-7, each of the electrical contacts 122,124,126,128,130 includes a stab portion 132,134,136,138,140 located perpendicular to a plate portion 112 of the base member 110. The stab portions 132,134,136,138,140 are each configured to extend into, and be mechanically coupled to and electrically connected with a corresponding one of the jaw members 12,14,16,18,20 (FIG. 8) of the socket assembly 10. In one example embodiment the stab portions 132,134,136,138,140 are each configured to be removably coupled to a corresponding one of the jaw members 12,14,16,18,20 (FIG. 8) of the socket assembly 10. Specifically, as shown in FIG. 7, the electrical contacts 122,124,126,128 are arranged in a rectangular pattern, and the fifth electrical contact 130 is located between the first and second electrical contacts 122,124.

As mentioned above, the first terminal end 21 of the circuit breaker 8 is configured to be plugged on to the electrical contacts 122,126. In order to allow for this functionality, in the exemplary embodiment the electrical contacts 122,126 each have at least one other stab portion 142,146,147 and a body portion 143,149. The stab portions 142,146,147 are located on opposing sides of the base member 110 from the stab portions 132,136. The body portions 143,149 of the electrical contacts 122,126 are each located substantially perpendicular to and extend from the corresponding stab portions 132,136, the body portion 143 is located substantially perpendicular to the stab portion 142, and the body portion 149 is located substantially perpendicular to the stab portion 146,147. In operation, the stab portions 142,146,147 are configured to extend into the first terminal 21 of the circuit breaker 8 in order to allow the circuit breaker 8 to be plugged onto the adapter. With respect to the second terminal end 22 of the circuit breaker 8, the electrical wires 30, which extend from the second terminal end 22, may be connected to the corresponding electrical contacts 124,128,130 by any suitable connecting mechanism known in the art (e.g., without limitation, soldering and/or via a phoenix connector).

Accordingly, by employing the energy management circuit breaker 8 in the metering assembly 2 in place of standard electrical meters (not shown), additional benefits can be realized. More specifically, the energy management circuit breaker 8, on top of being able to perform typical metering functions, also has a protocol based entirely on Wi-Fi communications. As such, the energy management circuit breaker 8 is able to wirelessly transmit metering data from the metering assembly 2 to one or more external devices (e.g., without limitation, cloud based computing system, desktop computer, laptop computer, mobile phone). For example and without limitation, a cloud based computing system allows for the metering data to be accessed by other energy management systems. Moreover, the circuit breaker 8 is able to provide advantageous thermal protection to the circuit. Specifically, if too much current is being drawn, the circuit breaker 8 will trip open. This is different from existing arrangements wherein electrical meters require separate, non-integrated, fuses and/or circuit breakers mounted separate from the meter (e.g., in a load center within a building). The existing setups are thus relatively inefficient. Additionally, the electrical contacts within the energy management circuit breaker 8 are compliant with an industry standard (e.g., UL 508 Standard by Underwriters Laboratories Inc., headquartered in Northbrook, Ill.). In this manner, the metering assembly 2 and adapter 100 therefor are advantageously able to be employed in more applications and markets than existing metering assemblies. Furthermore, it will be appreciated that the socket assembly 10 may be the same socket assembly employed in an existing metering assembly which has a typical electrical meter. As such, in operation an operator can simply and easily disconnect an existing electrical meter, and couple the adapter 100, with circuit breaker 8 attached thereto, to the socket assembly 10.

Figure 9:
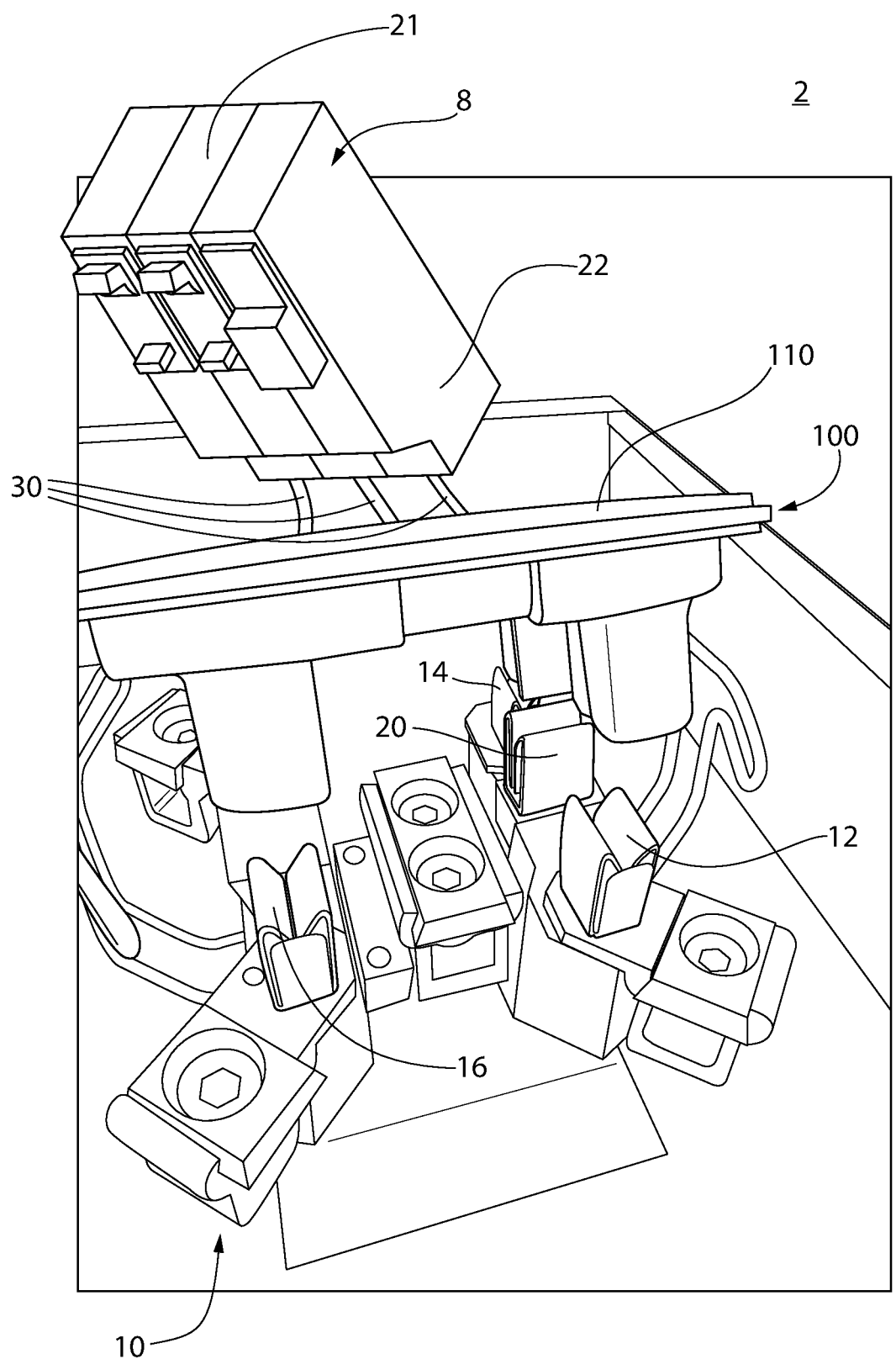
FIG. 9 is a partially assembled view of the metering assembly and adapter therefor.

FIG. 9 shows a partially assembled view of the metering assembly 2 and adapter 100 therefor, before the stab portions 132,134,136,138,140 (FIG. 7) have been plugged onto the jaw members 12,14,16,18,20 (FIG. 8), and before the circuit breaker 8 has been secured (e.g., plugged onto in the exemplary embodiment) to the opposing side of the base member 110. Accordingly, it will be appreciated that a method of converting electrical connections of a socket assembly 10 to electrical connections for an electrical switching apparatus 8 includes the steps of providing the socket assembly 10 with a plurality of jaw members 12,14, 16,18,20, providing an adapter 100 comprising a base member 110 and a plurality of electrical contacts 122,124,126, 128,130 each coupled to the base member, mechanically coupling and electrically connecting each of the plurality of electrical contacts 122,124,126,128,130 to a corresponding one of the plurality of jaw members 12,14,16,18,20, and electrically connecting each of the plurality of electrical contacts 122,124,126,128,130 to the electrical switching apparatus 8. The method may further include the step of transmitting metering data from the electrical switching apparatus 8 to an external device. The transmitting step may further comprise wirelessly transmitting the metering data from the electrical switching apparatus 8 to the external device, wherein the external device is selected from the group consisting of a cloud based computing system, a desktop computer, a laptop computer, and a mobile phone. The method may also further include the steps of detecting current passing through the electrical switching apparatus 8, and responsive to the current reaching a predetermined threshold, tripping open separable contacts of the electrical switching apparatus 8.

Example 2

Figure 10:
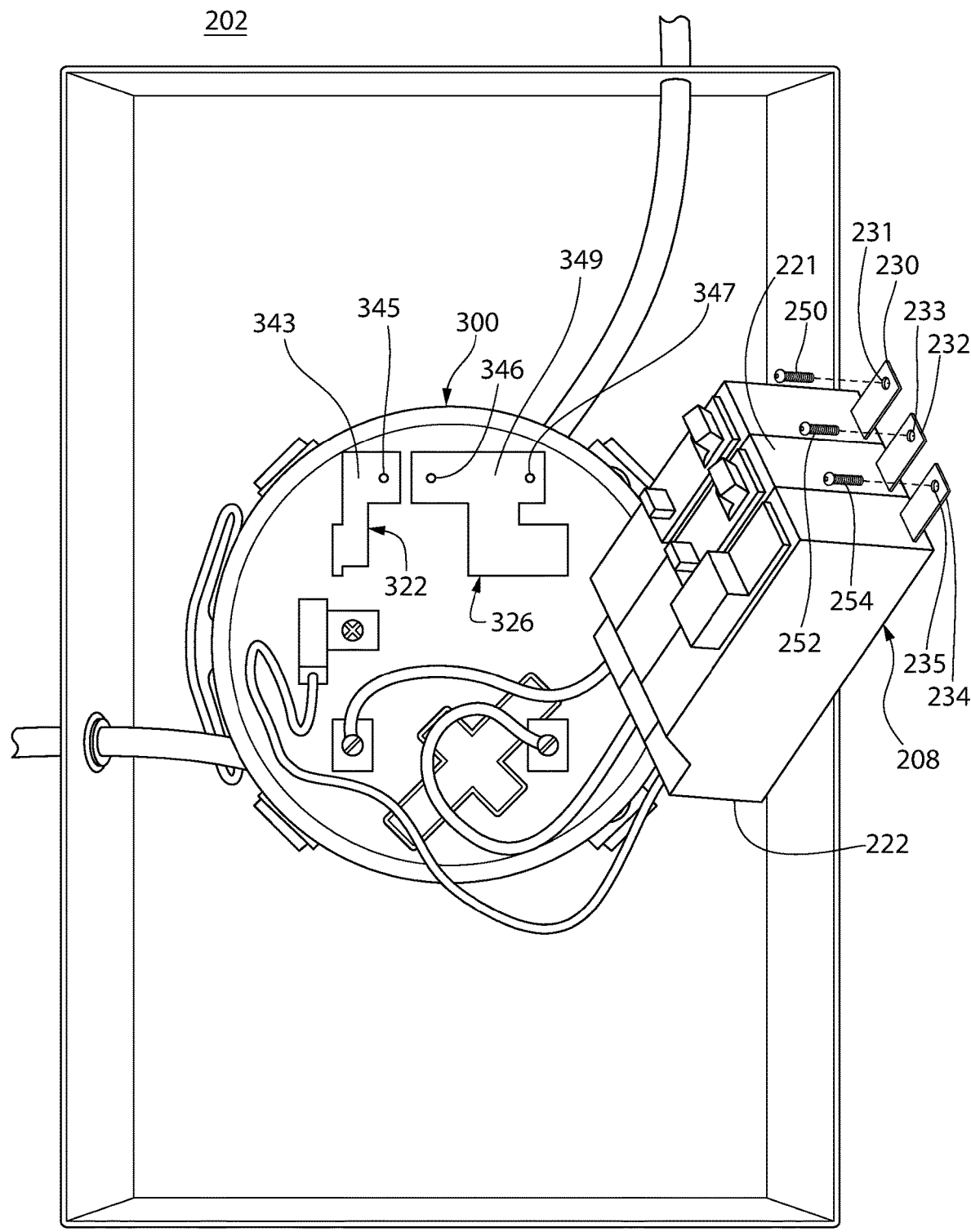
FIG. 10 is a top view of another metering assembly and adapter therefor, shown with the electrical switching apparatus partially removed from the adapter in order to see hidden structures, in accordance with another non-limiting embodiment of the disclosed concept.
Figure 11:
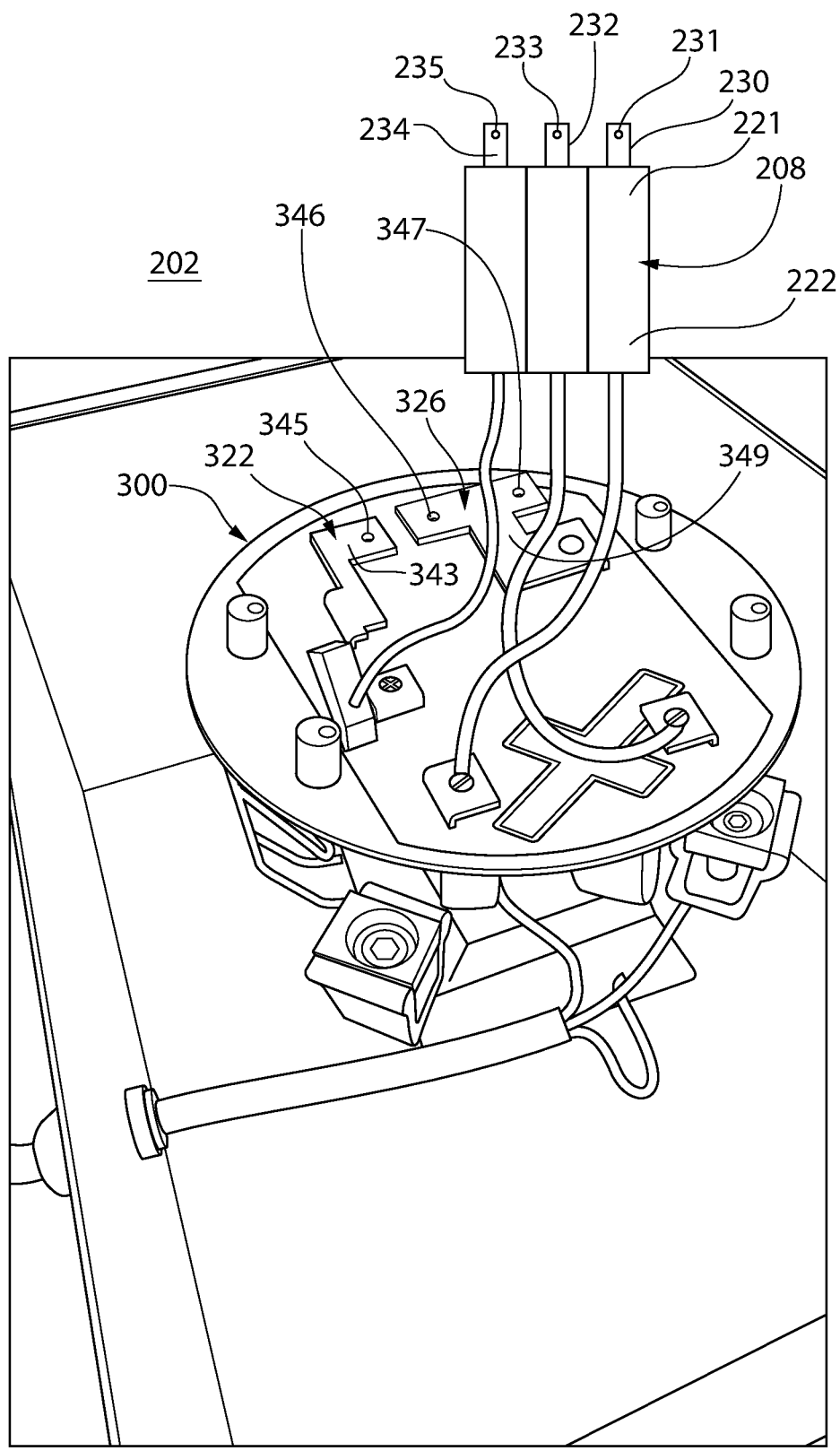
FIG. 11 is an isometric view of the metering assembly and adapter therefor of FIG. 10.

FIGS. 10 and 11 are top and isometric views, respectively, of another metering assembly 202 and adapter 300 therefor, in accordance with another non-limiting embodiment of the disclosed concept. It will be appreciated that the metering assembly 202 is structured and functions similar to the metering assembly 2, discussed above, and like reference numbers will be used to designate like components. Referring to FIG. 11, the electrical contacts 322,326 each include a corresponding body portion 343,349 extending from and being located substantially perpendicular to the corresponding stab portion. It is noted that no stab portions are shown in FIGS. 10 and 11. First, the electrical contacts 322,326 are entirely devoid of stab portions structured to mate with the circuit breaker 208, as will be discussed below. Second, the stab portions of the adapter 300 that are configured to mate with the socket assembly 10 are substantially the same as the stab portions 132,134,136,138,140 of the adapter 100, discussed above.

Continuing to refer to FIG. 11, the body portion 343 has a through hole 345, and the body portion 349 has a plurality of through holes 346,347. Furthermore, in one example embodiment the circuit breaker 208 is a bolt-on circuit breaker 208. The bolt-on circuit breaker 208 has a first terminal end 221 and a second terminal end 222. The first terminal end 221 has a plurality of electrical contacts 230,232,234 each having a thru hole 231,233,235. In operation, at least one of the through holes 345,346,347 of the body portions 343,349 is structured to be aligned with a corresponding thru hole 231,233,235 of one of the electrical contacts 230,232,234. This alignment allows for a bolt-on connection. See, for example, FIG. 10, which shows a number of bolt members 250,252,254 each structured to extend through the corresponding thru holes 231,233,235 and the corresponding through holes 345,346,347 in order to couple the circuit breaker 208 to the adapter 300 by a bolt-on connection. Accordingly, the metering assembly 202 advantageously accommodates the bolt-on circuit breaker 208 without stab portions extending into the circuit breaker, but rather via bolt members 250,252,254.

Example 3

Figure 12:
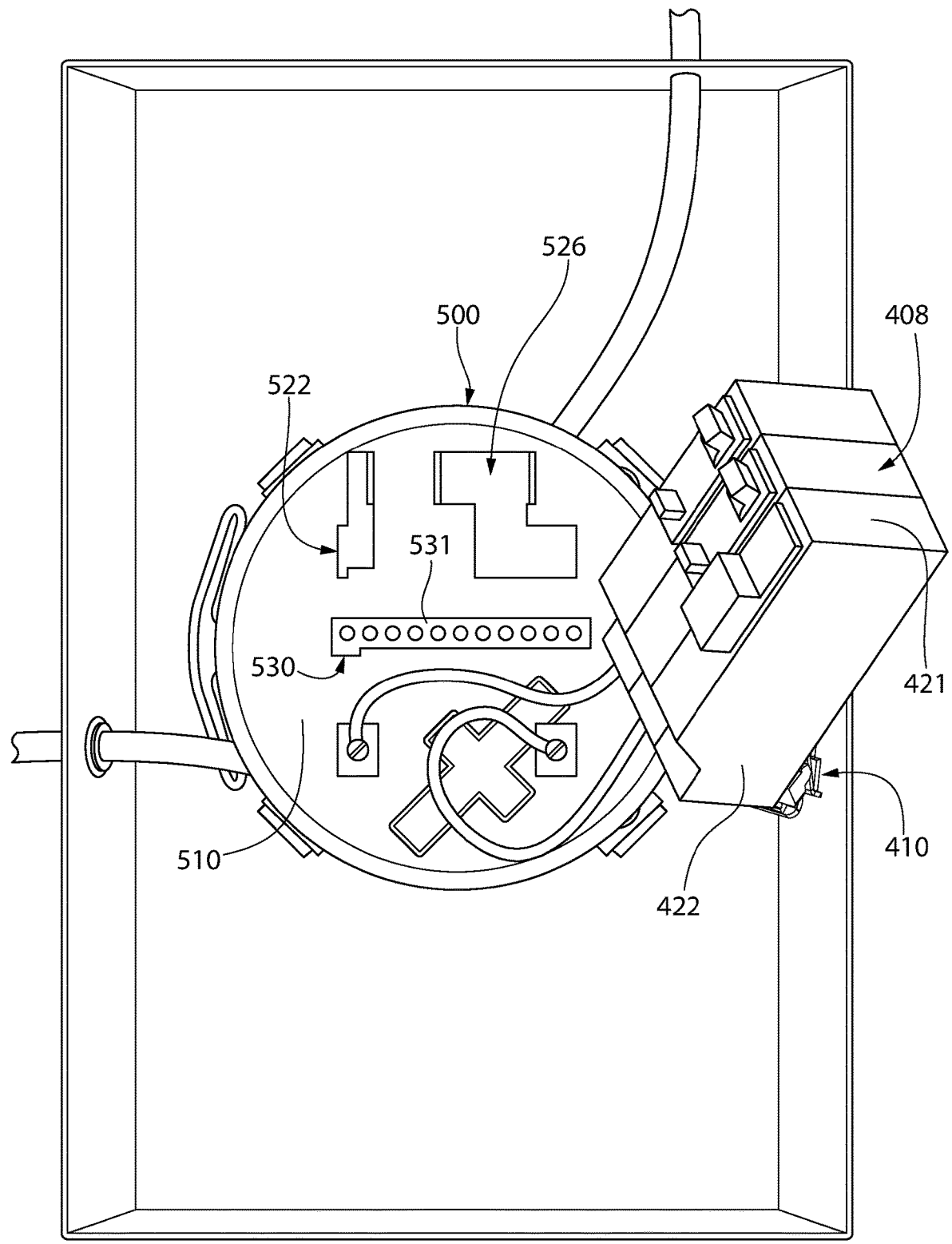
FIG. 12 is a top view of another metering assembly and adapter therefor, shown with the electrical switching apparatus partially removed from the adapter in order to see hidden structures, in accordance with another non-limiting embodiment of the disclosed concept.
Figure 13:
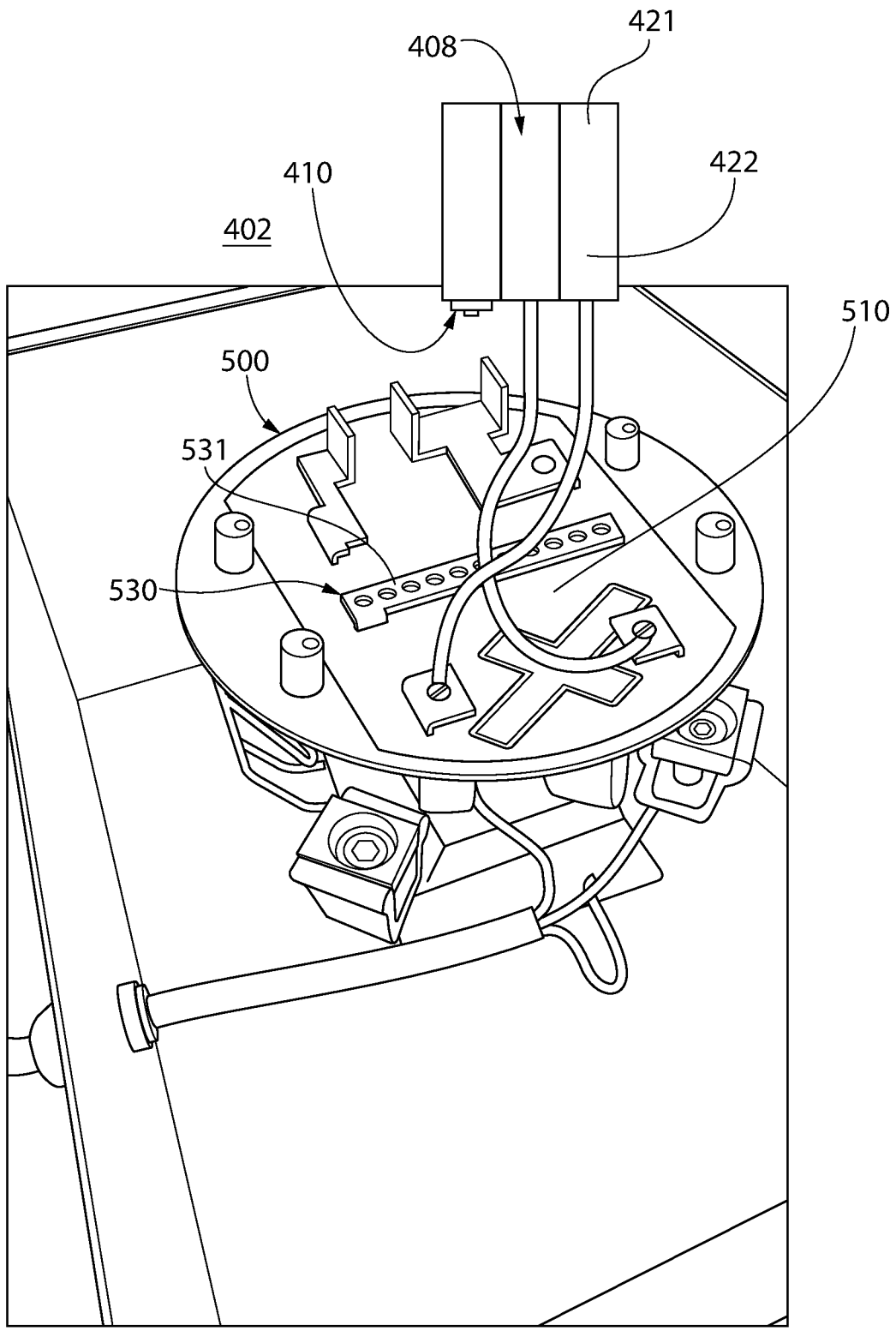
FIG. 13 is an isometric view of the metering assembly and adapter therefor of FIG. 12.

FIGS. 12 and 13 are top and isometric views, respectively, of another metering assembly 402 and adapter 500 therefor, in accordance with another non-limiting embodiment of the disclosed concept. It will be appreciated that the metering assembly 402 is structured and functions similar to the metering assembly 2, discussed above, and like reference numbers will be used to designate like components. In one example embodiment, the circuit breaker 408 of the metering assembly 402 is a plug-on neutral circuit breaker 408. For example, the circuit breaker has a first terminal end 421 and a second terminal end 422, and the first terminal end 421 is mechanically coupled to at least one of the plurality of electrical contacts 522,526 by a plug-on connection. Additionally, the circuit breaker 408 has a cleat member 410. In order to receive the cleat member 410, the adapter 500 is structured differently than the adapters 100,300, discussed above. Specifically, the electrical contact 530 of the adapter 500 has a load center neutral bus 531 structured to be mechanically coupled and electrically connected with the cleat member 410. The load center neutral bus 531 extends from the stab portion (not shown in FIGS. 12 and 13, but see stab portion 140 of adapter 100) of the electrical contact 530 and is located on an opposing side of the base member than the stab portion. Furthermore, the load center neutral bus 531 is elongated and generally extends from a first side of the base member 510, to a second, opposing side thereof.

Accordingly, it will be appreciated that the disclosed concept provides for an improved (e.g., without limitation, more versatile, economical, and better able to communicate) metering assembly 2,202,402 and adapter 100,300,500 and converting method therefor.

While example embodiments of the disclosed concept have been described with respect to the socket assembly 10 arranged as shown in FIG. 8 and the circuit breakers 8,208,408 described herein, it will be appreciated that the disclosed concept may be employed with other arrangements of socket assemblies and circuit breakers without departing from the scope of the disclosed concept. For example, while the socket assembly 10 is a 5-terminal socket assembly, it will be appreciated that the adapters 100,300, 500 may be modified in some embodiments to electrically connect to other types of socket assemblies, such as 4-terminal socket assemblies or other types of power meter sockets. Similarly, in some embodiments, the adapters 100, 300,500 may be modified to electrically connect to other types of circuit breakers.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof

What is claimed is:

1. An adapter for a metering assembly, said metering assembly comprising an electrical switching apparatus and a socket assembly, said socket assembly comprising a plurality of jaw members, said adapter comprising:
   a base member; and
   a plurality of electrical contacts each fixedly coupled to said base member and structured to be directly mechanically coupled and electrically connected to a corresponding one of said jaw members, each of said electrical contacts being structured to be electrically connected to said electrical switching apparatus.

2. The adapter of claim 1 wherein each of said electrical contacts extends through said base member.

3. The adapter of claim 2 wherein each of said electrical contacts comprises a stab portion configured to extend into said corresponding one of said jaw members.

4. The adapter of claim 3 wherein said base member comprises a plate portion disposed perpendicular to said stab portion of each of said electrical contacts.

5. The adapter of claim 3 wherein said plurality of electrical contacts comprises a first, second, third, and fourth electrical contacts arranged in a rectangular pattern and a fifth electrical contact disposed between the first and second electrical contacts.

6. The adapter of claim 3 wherein at least one of said electrical contacts comprises at least one other stab portion configured to extend into said electrical switching apparatus; and wherein said stab portion of said at least one of said electrical contacts and said at least one other stab portion of said at least one of said electrical contacts are disposed on opposing sides of said base member.

7. The adapter of claim 6 wherein said at least one said electrical contacts further comprises a body portion extending from and being disposed perpendicular to said stab portion of said at least one of said electrical contacts; and wherein said at least one other stab portion comprises a plurality of other stab portions.

8. The adapter of claim 3 wherein at least one of said plurality of electrical contacts comprises a body portion extending from and being disposed substantially perpendicular to said stab portion; wherein said body portion has at least one through hole; and wherein the at least one through hole of said body portion is structured to be aligned with a corresponding thru hole of an electrical contact of said electrical switching apparatus in order to be coupled thereto by a bolt-on connection.

9. The adapter of claim 8 wherein said at least one of said plurality of electrical contacts of said adapter comprises a first electrical contact and a second electrical contact; wherein said body portion of said first electrical contact has one through hole; and wherein said body portion of said second electrical contact has two through holes.

10. The adapter of claim 3 wherein one of said plurality of electrical contacts comprises a load center neutral bus extending from said stab portion of said one of said plurality of electrical contacts and being disposed on an opposing side of said base member.

11. The adapter of claim 10 wherein said load center neutral bus is elongated and generally extends from a first side of said base member to a second, opposing side thereof.

12. A metering assembly comprising:
   an electrical switching apparatus;
   a socket assembly comprising a plurality of jaw members; and
   an adapter comprising:
      a base member, and
      a plurality of electrical contacts each fixedly coupled to said base member and directly mechanically coupled and electrically connected to a corresponding one of said jaw members, each of said electrical contacts being electrically connected to said electrical switching apparatus.

13. The metering assembly of claim 12 wherein said electrical switching apparatus is disposed on a first side of said base member and said socket assembly is disposed on a second, opposing side of said base member.

14. The metering assembly of claim 12 wherein said electrical switching apparatus is a multi-pole circuit breaker; wherein said multi-pole circuit breaker has a first terminal end and a second terminal end; wherein said first terminal end is plugged onto at least one of said plurality of electrical contacts; and wherein said metering assembly further comprises a plurality of electrical wires electrically connecting said second terminal end to at least one other electrical contact of said plurality of electrical contacts.

15. The metering assembly of claim 12 wherein said electrical switching apparatus is a multi-pole circuit breaker; wherein said multi-pole circuit breaker has a first terminal end and a second terminal end; wherein said first terminal end comprises a second plurality of electrical contacts each having a thru hole; and wherein said metering assembly further comprises a plurality of bolt members each extending through a corresponding one of said thru holes of said second plurality of electrical contacts and one of said plurality of electrical contacts in order to couple said circuit breaker to said adapter by a bolt-on connection.

16. The metering assembly of claim 12 wherein said electrical switching apparatus comprises a cleat member; and wherein one of said plurality of electrical contacts comprises a load center neutral bus structured to be mechanically coupled and electrically connected with said cleat member.

17. The metering assembly of claim 16 wherein said electrical switching apparatus is a multi-pole circuit breaker; wherein said multi-pole circuit breaker has a first terminal end and a second terminal end; and wherein said first terminal end is mechanically coupled to at least one of said plurality of electrical contacts by a plug-on connection.

18. The metering assembly of claim 12 wherein said electrical switching apparatus is an energy management circuit breaker.

19. The metering assembly of claim 12 wherein each of said electrical contacts comprises a stab portion extending into and being removably coupled to said corresponding one of said jaw members.

20. The metering assembly of claim 19 wherein said base member comprises a plate portion disposed perpendicular to said stab portion of each of said electrical contacts.

21. The metering assembly of claim 19 wherein said plurality of electrical contacts comprises a first, second, third, and fourth electrical contacts arranged in a rectangular pattern and a fifth electrical contact disposed between the first and second electrical contacts.

22. The metering assembly of claim 19 wherein at least one of said electrical contacts comprises at least one other stab portion configured to extend into said electrical switching apparatus; and wherein said stab portion of said at least one of said electrical contacts and said at least one other stab portion of said at least one of said electrical contacts are disposed on opposing sides of said base member.

23. A method of converting electrical connections of a socket assembly to electrical connections for an electrical switching apparatus comprises the steps of:
   providing said socket assembly with a plurality of jaw members;
   providing an adapter comprising a base member and a plurality of electrical contacts each fixedly coupled to said base member;
   directly mechanically coupling and electrically connecting each of said plurality of electrical contacts to a corresponding one of said plurality of jaw members; and
   electrically connecting each of said plurality of electrical contacts to said electrical switching apparatus.

24. The method of claim 23 wherein the method further comprises the step of:
   transmitting metering data from said electrical switching apparatus to an external device.

25. The method of claim 24 wherein the transmitting step further comprises:
   wirelessly transmitting said metering data from said electrical switching apparatus to said external device, said external device being selected from the group consisting of a cloud based computing system, a desktop computer, a laptop computer, and a mobile phone.

26. The method of claim 24 further comprising the steps of:
   detecting current passing through said electrical switching apparatus; and
   responsive to said current reaching a predetermined threshold, tripping open separable contacts of said electrical switching apparatus.

27. The method of claim 23 wherein each of said electrical contacts comprises a stab portion; and wherein said base member comprises a plate portion disposed perpendicular to said stab portion of each of said electrical contacts.

* * * * *